(12) United States Patent
Shimizu et al.

(10) Patent No.: US 8,043,900 B2
(45) Date of Patent: Oct. 25, 2011

(54) SEMICONDUCTOR INTEGRATED CIRCUIT DEVICE AND A METHOD OF MANUFACTURING THE SAME

(75) Inventors: Hiroharu Shimizu, Tokyo (JP); Masakazu Nishibori, Tokyo (JP); Toshihiko Ochiai, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 177 days.

(21) Appl. No.: 12/545,843

(22) Filed: Aug. 23, 2009

(65) Prior Publication Data

US 2010/0059794 A1    Mar. 11, 2010

(30) Foreign Application Priority Data

Sep. 11, 2008  (JP) ................................. 2008-232882

(51) Int. Cl.
*H01L 21/82* (2006.01)
(52) U.S. Cl. ....................................... 438/128; 438/129
(58) Field of Classification Search .................. 438/128, 438/129
See application file for complete search history.

(56) References Cited

U.S. PATENT DOCUMENTS

| 7,325,214 B2 * | 1/2008 | Liao ................................ 716/120 |
| 7,326,595 B2 * | 2/2008 | Kuroki ............................ 438/128 |
| 2006/0202231 A1 | 9/2006 | Yamamoto |

FOREIGN PATENT DOCUMENTS

| JP | 11-135734 A | 5/1999 |
| JP | 2006-228982 A | 8/2006 |
| JP | 2006-253375 A | 9/2006 |
| JP | 2007-73885 A | 3/2007 |

* cited by examiner

*Primary Examiner* — Thien F Tran
(74) *Attorney, Agent, or Firm* — Miles & Stockbridge P.C.

(57) ABSTRACT

To provide a circuit layout design method that can prevent degradation of the circuit reliability even in highly miniaturized circuit cells.

In order to prevent noise from a power supply potential or a reference potential with a large potential difference from affecting a gate electrode and causing a malfunction, a first plug connected to the gate electrode and a second plug to which the power supply potential or the reference potential is supplied are required to be spaced from each other by a distance sufficient for the noise from the power supply potential or the reference potential not to affect the first plug. To this end, among the second plugs placed at equal intervals under the wiring, only the second plug placed at a layout position that is not sufficiently spaced from the first plug is deleted at the time of planar layout design.

8 Claims, 14 Drawing Sheets

SEMICONDUCTOR INTEGRATED CIRCUIT DEVICE AND A METHOD OF MANUFACTURING THE SAME

CROSS-REFERENCE TO RELATED APPLICATION

The disclosure of Japanese Patent Application No. 2008-232882 filed on Sep. 11, 2008 including the specification, drawings and abstract is incorporated herein by reference in its entirety.

BACKGROUND OF THE INVENTION

The present invention relates to a semiconductor integrated circuit device and technology for manufacturing the semiconductor integrated circuit device, and in particular relates to the technology effectively applied to the manufacture of a semiconductor integrated circuit device including fine semiconductor elements and wirings.

Conventionally, in the layout design of a semiconductor integrated circuit device, power-feeding diffusion layers are extended in one direction and MOS transistors constituting a desired circuit are arranged therebetween, and these are recognized as a cell. One example of such a cell layout is described in Japanese patent laid-open No. 2006-253375, for example. Moreover, a power-feeding diffusion layer formed so as to extend in one direction may be referred to as a "tap".

Japanese patent Laid-Open No. 11-135734 discloses a technology, wherein in a semiconductor device having a diode comprising a drain region and a p-type well, suppose that a distance between one edge of a contact in the drain region and an edge of a contact in the well tap region is L1 and a distance between other edge of the contact in the drain region and an edge of other contact in the well tap region is L2, then L2≧L1. By setting such a condition, electrostatic destruction (ESD) without avalanche breakdown in the diode is effectively prevented.

Japanese patent laid-open No. 2007-73885 discloses a technology that enables multiple types of power supplies without damaging the degree of integration in a semiconductor integrated circuit device comprising a plurality of basic cells.

Japanese patent laid-open No. 2006-228982 discloses a technology, wherein in a semiconductor integrated circuit device in which a plurality of standard cells having a circuit diffusion layer for forming a circuit is arranged, if the circuit diffusion layers of the adjacent standard cells are arranged at predetermined intervals and formed with mutually different phases, then a tap diffusion layer for forming a power supply potential or an earth potential in the vicinity of the relevant adjacent circuit diffusion layers is formed discontinuously. Thereby, a high degree of integration of patterns is relatively easily achieved without reducing the pattern resolution and without causing problems such as phase discrepancy.

SUMMARY OF THE INVENTION

As the miniaturization of an individual circuit cell that forms a semiconductor integrated circuit has progressed recently, semiconductor elements and wirings to be arranged in the circuit cell are not only miniaturized but also the interior of the circuit cell is utilized without waste, and the semiconductor elements and wirings are arranged.

The height of a cell, (the length of a cell in the direction perpendicular to the tap) is determined by the number of wirings that can pass through over the cell. In particular, it is determined by the consistency between the second layer wiring (M2 wiring) and the third layer wiring (M3 wiring). Specifically, it is determined by the minimum wiring pitch of the second layer wiring (M2 wiring). For example, in a cell as shown in FIG. 14, six wirings can pass through between the taps, and the cell can be recognized as a cell over which seven wirings including a wiring above one of the taps can pass through. Such a cell is referred to as a 7-pitch cell. Note that, the minimum wiring pitch is equal to the width of the second layer wiring formed with the minimum feature size plus the spacing between the wirings formed with the minimum feature size. Here, in the conventional cells, an 8-pitch cell or a 9-pitch cell has been mainstream. The present inventor has attempted to realize the 7-pitch cell as shown in FIG. 11 in order to reduce the chip size further. In arranging semiconductor elements and wirings in a highly miniaturized circuit cell, the present inventors have found out the problem to be solved as follows.

FIG. 11 is a plan view of a principal part of a circuit cell that forms a logic circuit included in the above-described semiconductor integrated circuit.

In a circuit cell region, there are formed a gate electrode 101, an active region 102 in which the source/drain of an MISFET (Metal Insulator Semiconductor Field Effect Transistor) is formed, wirings 103, 104, and plugs 105, 106, and 107 for electrically connecting the wirings 103, 104 to the active region 102 or the gate electrode 101. The circuit cell is formed from these members. The wiring 104, and the plug 106 connected to the wiring 104 are the wiring and plug for feeding power, to which a power supply potential or a reference potential is supplied. A potential higher than that of the wiring 103 and plug 105 that are electrically connected to the gate electrode 101 is supplied to these wiring 104 and plug 106. Moreover, in order to feed a high potential, a plurality of plugs 106 is placed at equal intervals under the wiring 104. FIG. 12 and FIG. 13 are plan views of the principal part for clarifying the configuration of these gate electrodes 101, active region 102, wirings 103, 104, plugs 105, 106, and 107, and the connection status to other members. FIG. 12 illustrates only the gate electrode 101, active region 102, and plugs 105, 106, and 107, and FIG. 13 illustrates only the wirings 103, 104 and plugs 105, 106, and 107.

In order to prevent noise from the power supply potential or reference potential with a large potential difference from affecting the gate electrode 101 and causing a malfunction, the plug 105 connected to the gate electrode 101 and the plug 106 to which the power supply potential or the reference potential is supplied are required to be spaced from each other by at least a specified value (e.g., approximately 1.5 times the diameter of the plug 105). Here, a plug 106A among the plugs 106 shown in the planar layouts of FIG. 11 to FIG. 13 cannot be spaced by at least a specified value from a plug 105A among the plugs 105. As one of the means for dissolving such a problem, the planar layout of the gate electrode 101 and the wiring 103 might be adjusted. However, in a highly miniaturized circuit cell, it is now difficult to adjust the planar layout of the gate electrode 101 and wiring 103 that have been arranged utilizing the interior of the circuit cell without waste. Moreover, as another means for dissolving the above-described problem, the plug 106A and the plug 105A might be sufficiently spaced from each other by expanding the circuit cell region, however, this countermeasure makes it difficult to achieve miniaturization of the circuit cell.

It is an object of the present invention to provide a technology that can miniaturize circuit cells.

Moreover, it is another object of the present invention to provide a circuit layout design method that can prevent the degradation of circuit reliability even in highly miniaturized circuit cells.

The above and other objects and novel features of the present invention will be apparent from the description and the accompanying drawings of the present specification.

A summary of representative inventions among a plurality of inventions disclosed in the present application is described briefly as follows.

According to an aspect of the present invention, a method of manufacturing a semiconductor integrated circuit device with an integrated circuit comprises the steps of (a) preparing a first layout of the integrated circuit including a plurality of active regions, a plurality of gate electrodes, a plurality of signaling wirings, a plurality of power-feeding wirings, a plurality of signaling plugs, and a plurality of power-feeding plugs and (b) deleting the power-feeding plug that is placed within a first distance from each of the signaling plugs among the power-feeding plugs from the first layout, wherein in the step (a), the power-feeding plugs for electrically connecting the power-feeding wiring to the active region are placed under the power-feeding wiring, wherein a potential higher than that of the signaling wiring and the signaling plug is supplied to the power-feeding wiring and the power-feeding plug, and wherein the power-feeding plug to be deleted from the first layout in the step (b) is close to the signaling plug, close enough to impair an operation of the integrated circuit.

According to another aspect of the present invention, a semiconductor integrated circuit device comprises an element isolation region and a first active region defined by the element isolation region in a semiconductor substrate, wherein the first active region is formed in the semiconductor substrate and includes a first well of a first conductivity type; wherein the first active region further includes a first region which extends in a first direction and in which a plurality of MISFETs is formed, and a second region which extends in the first direction and feeds power to the MISFETs; wherein each gate electrode of the MISFETs extends in a second direction intersecting the first direction; wherein a plurality of first plugs is formed in each of the gate electrodes of the MISFETs, respectively; and wherein in the second region, a plurality of second plugs is placed along the first direction, and the second plug is not formed within a range less than 2.5 times a diameter of the first plug from a center of the first plug.

The advantages obtained by the representative aspects among the aspects of the present invention disclosed in the present application are described briefly as follows.

Circuit cells can be miniaturized.

The degradation of circuit reliability can be prevented even in a highly miniaturized circuit cell.

DETAILED DESCRIPTION OF THE PREFERRED EMBODIMENTS

Figure 1:
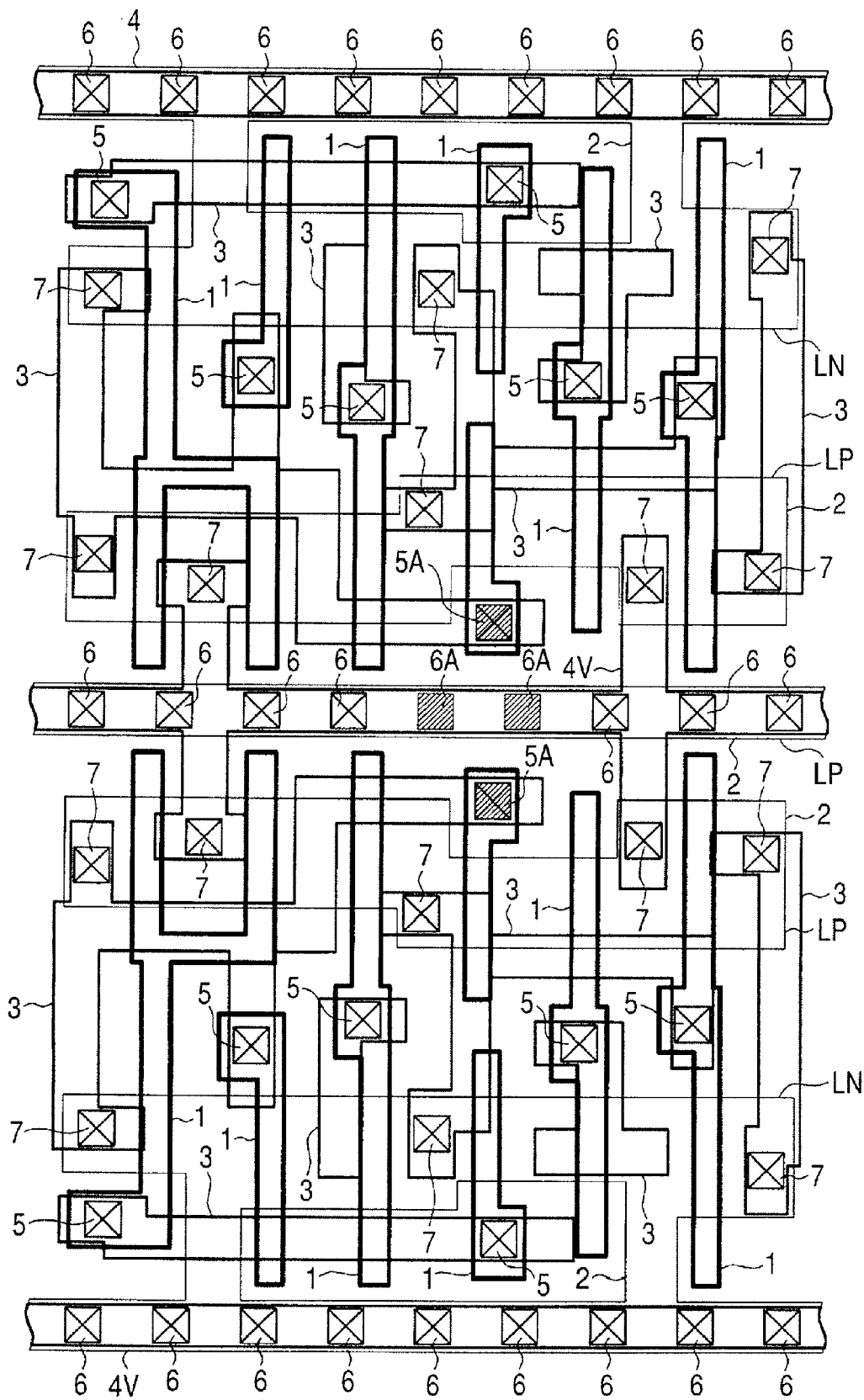
FIG. 1 is a plan view of a principal part of a circuit cell that forms a logic circuit included in a semiconductor integrated circuit according to an embodiment of the present invention.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step etc.) is not necessarily indispensable, except for the case where it is clearly specified in particular and where it is considered to be clearly indispensable from a theoretical point of view, etc. Moreover, when described as "comprises A" or "comprising A" with regard to the constituent elements or the like in the embodiments or the like, for example unless otherwise specially stated that "comprises only a relevant element" or "comprising only a relevant element", elements other than the relevant element shall not be excluded, of course.

Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above.

Moreover, when referred to a material or the like, unless otherwise specifically stated not to be so or unless otherwise not to be so in principle or situationally, the specified material is a principal material and accordingly a secondary element, an additive, an additional element, and the like shall not be excluded. A silicon member shall contain not only a pure silicon but also an additive impurity, a binary or ternary alloy (e.g., SiGe) or the like including silicon as a principal element, for example unless otherwise specifically stated.

Throughout the accompanying drawings for illustrating the embodiments, the same member having the same function is given the same reference numeral to omit the duplicated description.

Moreover, in the accompanying drawings used in the embodiments, hatching may be applied even to a plan view for viewability.

Hereinafter, the embodiments of the present invention will be described in detail in accordance with the accompanying drawings.

Figure 14:
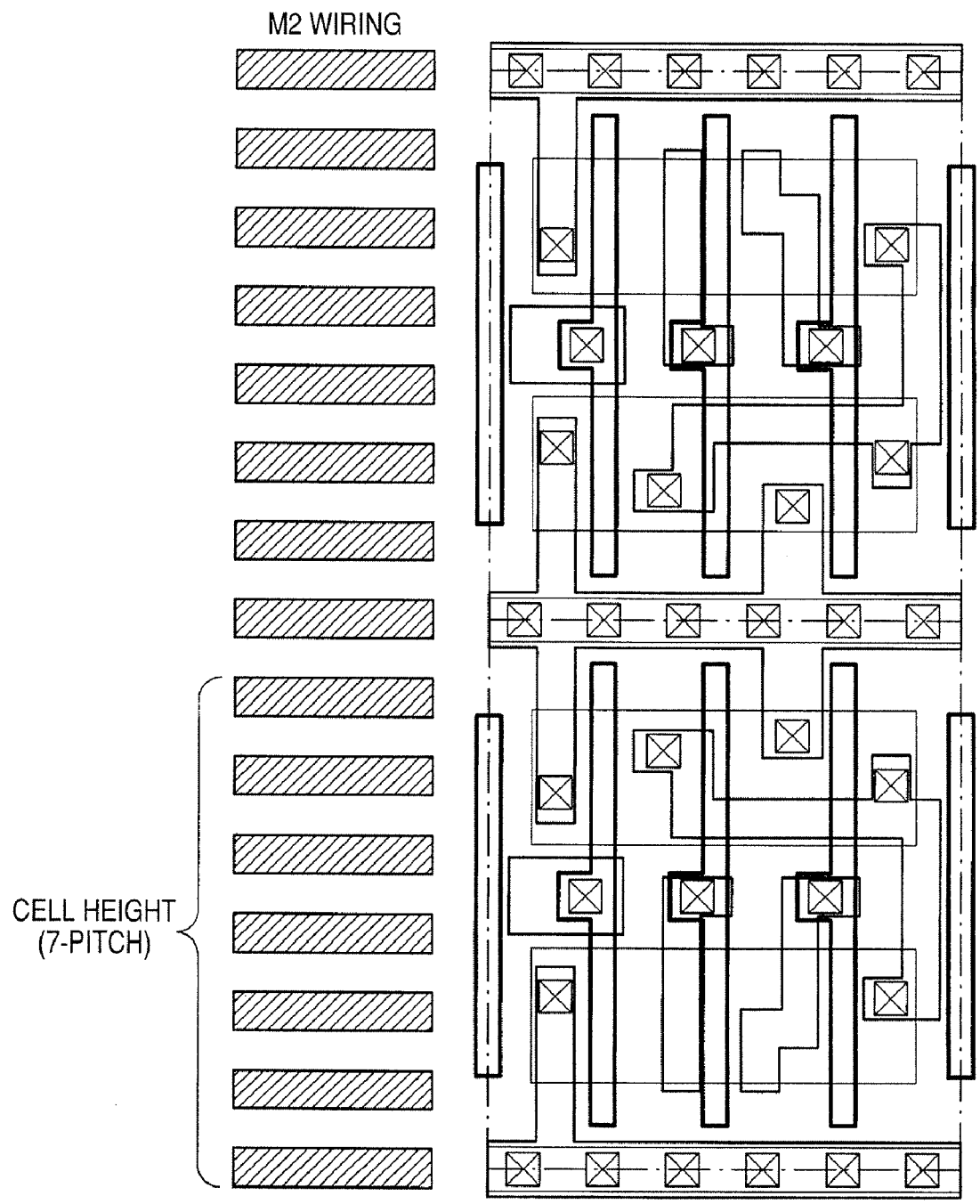
FIG. 14 is a reference drawing for illustrating a wiring pitch of the present embodiment.

The height of a cell illustrated in the embodiments (the length of a cell in a direction perpendicular to a tap) is the same as that of FIG. 14 as described above. That is, the height of a cell is determined by the number of wirings that can pass through over the cell. In particular, it is determined by the consistency between the second layer wiring (M2 wiring) and the third layer wiring (M3 wiring). Specifically, it is determined by the minimum wiring pitch of the second layer wiring (M2 wiring). In a cell shown in FIG. 1, six wirings can pass through between taps, and the cell can be recognized as a cell over which seven wirings including a wiring above one of the taps can pass through. That is, the cell comprises a 7-pitch cell. Note that, the minimum wiring pitch here is equal to the width of the second layer wiring formed with the minimum feature size plus the spacing between the wirings formed with the minimum feature size.

A semiconductor integrated circuit device of this embodiment includes a logic circuit (integrated circuit), for example, such as a selector circuit, an exclusive OR (XOR) circuit, or a flip-flop circuit.

Figure 2:
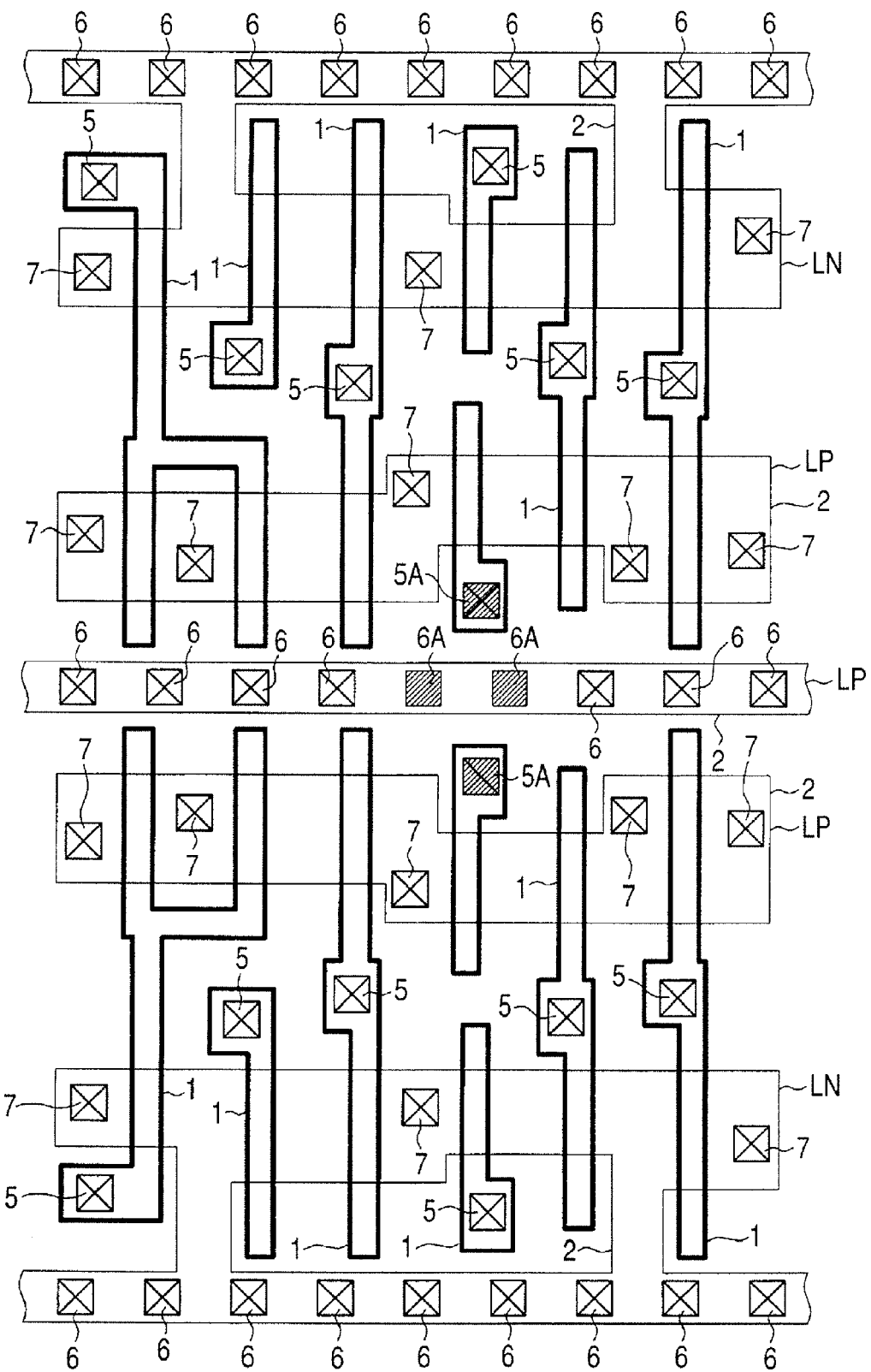
FIG. 2 is a plan view of the principal part of the circuit cell that forms the logic circuit included in the semiconductor integrated circuit according to the embodiment of the present invention.
Figure 3:
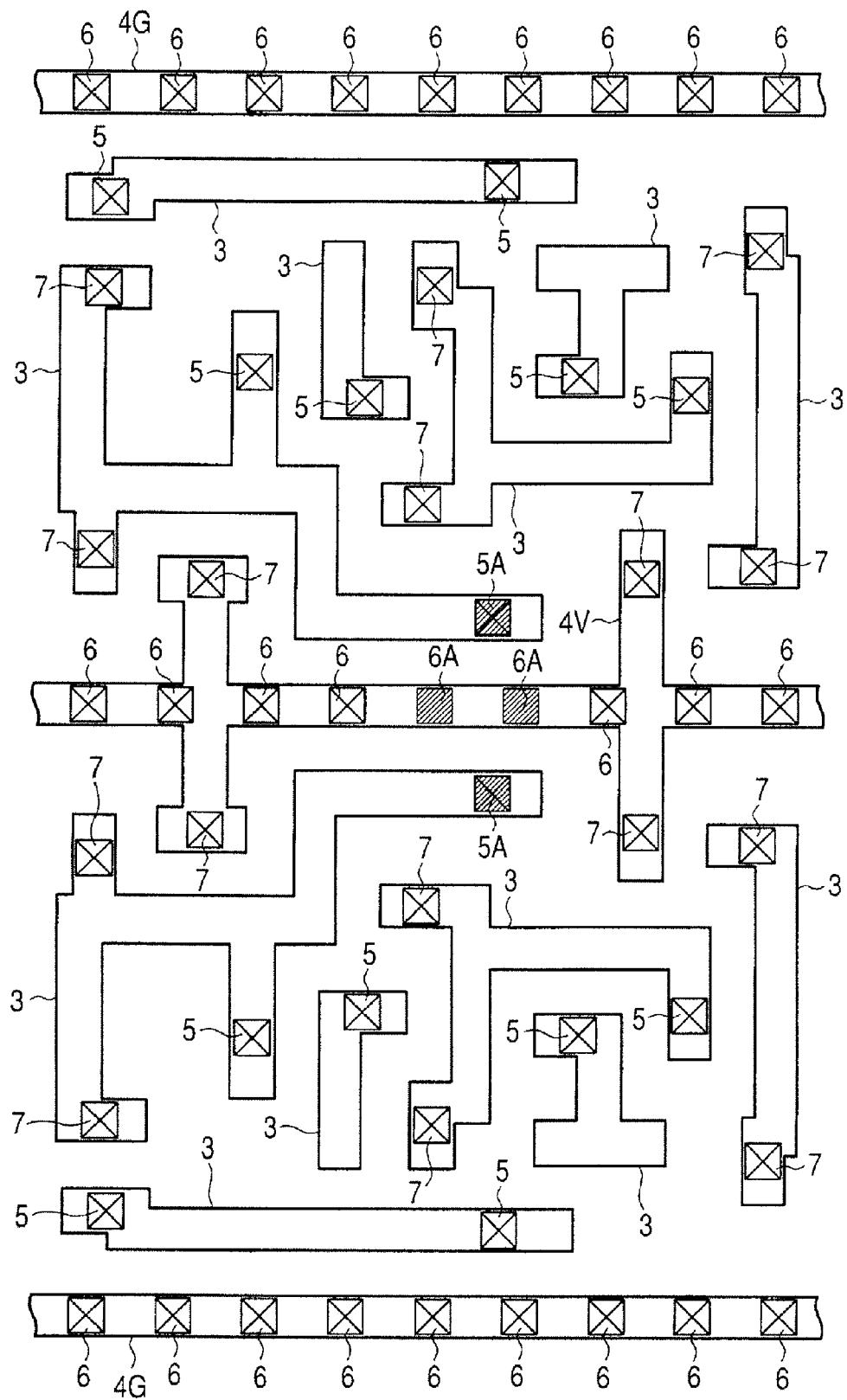
FIG. 3 is a plan view of the principal part of the circuit cell that forms the logic circuit included in the semiconductor integrated circuit according to the embodiment of the present invention.

FIG. 1 to FIG. 3 are plan views of a principal part of a circuit cell that forms this logic circuit, wherein the vicinity of a boundary between adjacent two circuit cells is illustrated. FIG. 1 illustrates MISFET constituent members (a gate electrode and an active region defined in a main surface of a semiconductor substrate), a first layer wiring, and a plug for electrically connecting the MISFET constituent member to the first layer wiring, FIG. 2 illustrates only the MISFET constituent members and plugs at the same positions as in FIG. 1, and FIG. 3 illustrates only the first layer wiring and plugs at the same positions as in FIG. 1.

In a circuit cell region, there are formed a gate electrode 1, an active region 2 where a source/drain of a MISFET is formed, wirings 3, 4, and plugs 5, 6, and 7 for electrically connecting the wirings 3, 4 to the active region 2 and the gate electrode 1. The circuit cell is formed from these members. The active region 2 is defined, for example, by forming a shallow groove type isolation region called STI (Shallow Trench Isolation) or SGI (Shallow Groove Isolation) in the main surface of the semiconductor substrate. The STI is a region that is formed by embedding an insulating film such as a silicon oxide film into a groove formed in the semiconductor substrate. This isolation region defines an active region LN and an active region LP.

The gate electrode 1 is formed from a polysilicon film, for example, and is patterned via a gate insulating film formed from a thin silicon oxide film or the like over the main surface of the semiconductor substrate. The gate length is no greater than 65 nm, for example. A plurality of gate electrodes 1 of n-channel type MISFET is formed in the active region LN that laterally extends in the view, and is formed so as to vertically extend in the view, respectively. Likewise, a plurality of gate electrodes 1 of p-channel type MISFET is formed in the active region LP that laterally extends in the view, and is formed so as to vertically extend in the view, respectively. Moreover, among polysilicon films constituting the gate electrodes 1, an n-type impurity is introduced into the polysilicon of the n-channel type MISFET, and a p-type impurity is introduced into the polysilicon of the p-channel type MISFET.

Moreover, the active region LN is a region where a p-type well is formed in the semiconductor substrate. Of the active region LN, in a region where the n-channel type MISFET is formed, an $n^-$-type semiconductor region and an $n^+$-type semiconductor region are formed in the surface of the p-type well on both sides of the gate electrode 1, and these regions serve as a source/drain region of an LDD (Lightly Doped Drain) structure. Of the active region LN, in a power-feeding region where a plurality of plugs 6 is placed, a $p^+$-type semiconductor region is formed in the surface of the p-type well. During the operation of the n-channel type MISFET, a potential that is supplied to the power-feeding active region LN via a wiring 4G will be applied to the p-type well of the n-channel type MISFET.

Moreover, the active region LP is a region where an n-type well is formed in the semiconductor substrate. Of the active region LP, in the region where the p-channel type MISFET is formed, a $p^-$-type semiconductor region and a $p^+$-type semiconductor region are formed in the surface of the n-type well on both sides of the gate electrode 1, and these regions serve as a source/drain region of the LDD (Lightly Doped Drain) structure. Of the active region LP, in a power-feeding region where a plurality of plugs 6 is placed, an $n^+$-type semiconductor region is formed in the surface of the n-type well. During the operation of the p-channel type MISFET, a potential supplied to the power-feeding active region LP via a wiring 4V will be applied to the n-type well of the p-channel type MISFET.

The impurity concentrations of the $p^-$-type semiconductor region and the $p^+$-type semiconductor region are higher than that of the p-type well, and the impurity concentrations of the $n^-$-type semiconductor region and the $n^+$-type semiconductor region are higher than that of the n-type well.

Moreover, the surface of the gate electrode 1, and the surface of the active region LN (the surface of the $n^+$-type semiconductor region in the region where the n-channel type MISFET is formed, as well as the surface of the $p^+$-type semiconductor region in the power-feeding region) as well as the surface of the active region LP (the surface of the $p^+$-type semiconductor region in the region where the p-channel type MISFET is formed, as well as the surface of the $n^+$-type semiconductor region in the power-feeding region) are subjected to salicide process to form a silicide layer. The silicide layer comprises cobalt silicide, nickel silicide, molybdenum silicide, titanium silicide, or platinum silicide, for example. Such a silicide layer reduces the contact resistance to the plug.

The plugs 5, 6, and 7 are formed so as to be embedded into a contact hole that is opened in an interlayer insulating film formed over the main surface of the semiconductor substrate. The wirings 3, 4 are formed over this interlayer insulating film.

The wiring (power-feeding wiring) 4, and the plug 6 (power-feeding plug) connected to the wiring 4 are the wiring and plug for feeding power, to which a power supply potential or a reference potential is supplied. A potential different from that of the wiring (signaling wiring) 3 and the plug (signaling plug) 5 that are electrically connected to the gate electrode 1 is supplied to these wiring 4 and plug 6. Specifically, a potential higher than the potential supplied to the gate electrode 1 is supplied to these wiring 4 and plug 6. Moreover, in order to feed a high potential, a plurality of plugs 6 is placed at equal intervals under the wiring 4 except for a part thereof. FIG. 2 and FIG. 3 are plan views of the principal part for clarifying the configuration of these gate electrodes 1, active region 2, wirings 3, 4, and plugs 5, 6, and 7, and the connection status to other members. As described above, FIG. 2 illustrates only the gate electrode 1, active region 2, and plugs 5, 6, and 7, and FIG. 3 illustrates only the wirings 3, 4 and plugs 5, 6, and 7.

As shown in FIG. 1 and FIG. 3, the power-feeding wiring (wiring 4) includes the wiring 4V for supplying a power supply potential VDD and the wiring 4G for supplying a reference potential GND. Moreover, as shown in FIG. 1 and FIG. 2, of the active region LN, a power-feeding region connected to the wiring 4V via the plug 6 extends in the horizontal direction in the view. This corresponds to a central portion in the view. Likewise, of the active region LP, a power-feeding region connected to the wiring 4G via the plug 6 extends in the horizontal direction in the view. These correspond to the top portion and the bottom portion in the view.

Here, as the miniaturization of the circuit cell progresses, in order to prevent noise from the power supply potential or reference potential with a large potential difference from affecting the gate electrode 1 and causing a malfunction, the plug 5 connected to the gate electrode 1 and the plug 6 to which the power supply potential or the reference potential is supplied are required to be spaced from each other by a distance (a first distance) sufficient for the noise from the power supply potential or the reference potential not to affect the plug 5. For example, the shortest distance to be spaced between the edge of the plug and the edge of the plug 6 is required to be at least 1.5 times the diameter of the plug 5 or the plug 6. In other words, the center of the plug 5 and the center of the plug 6 are required to be spaced from each other by a distance of approximately at least 2.5 times the diameter of the plug 5 or the plug 6. Moreover, the center of the plug 5 and the center of the plug 6 are required to be spaced from each other by a distance of at least the minimum feature size of the first layer wiring.

For example, if all of the plugs 6 are placed at equal intervals under the wiring 4 and the plug 6 is also formed at a layout position 6A shown in FIG. 1 to FIG. 3, the plug 6 at the layout position 6A cannot be sufficiently spaced from a plug (signaling plug) 5A among the plugs 5. In this embodiment, under such a condition, a layout is made such that the plug 6 is not arranged at such a layout position 6A and each of the plugs 5 is sufficiently spaced from the plug 6 with a high potential difference. Thereby, each of the plugs 5 can be spaced from the plug 6 without planarly expanding the circuit cell. Namely, within a range less than 1.5 times the diameter of the plug 5A from the edge of the plug 5A that is connected to the gate electrode 1, no power-feeding plug 6 is placed. In other words, if the center of the power-feeding plug 6 is placed within a range less than 2.5 times the diameter of the plug 5A from the center of the plug 5A that is connected to the gate electrode 1, then this plug 6 will not be placed. Moreover, if the distance between the center of the plug 5 and the center of the plug 6 is smaller than the minimum feature size of the first layer wiring, this plug 6 will not be placed.

Moreover, the wiring 4 with the layout position 6A includes a portion extending between two adjacent circuit cells, and the layout position 6A is included in a portion extending between the two adjacent circuit cells, and the portion extending between the two adjacent circuit cells is a portion included in the two circuit cells in common.

Only at the layout position 6A that is not sufficiently spaced from the plug 5, the placement of the plug 6 to which the power supply potential or the reference potential is supplied is omitted. It is therefore possible to prevent problems, such as degradation of the characteristic of an MISFET in the circuit cell, a decrease of the operation speed of the circuit, or that sufficient power cannot be supplied to the circuit, from occurring.

Moreover, in the power-feeding active regions LN, LP, a slight voltage drop by the amount that the plug 6A is omitted might occur. However, since a large number of plugs 6 are placed and the power-feeding wirings 4V, 4G are arranged over the power-feeding active regions LN, LP, there is no substantial voltage drop.

Hereinafter, a method of designing a circuit cell with a planar layout as described above of this embodiment and a method of arranging a plurality of the circuit cells will be described.

Figure 4:
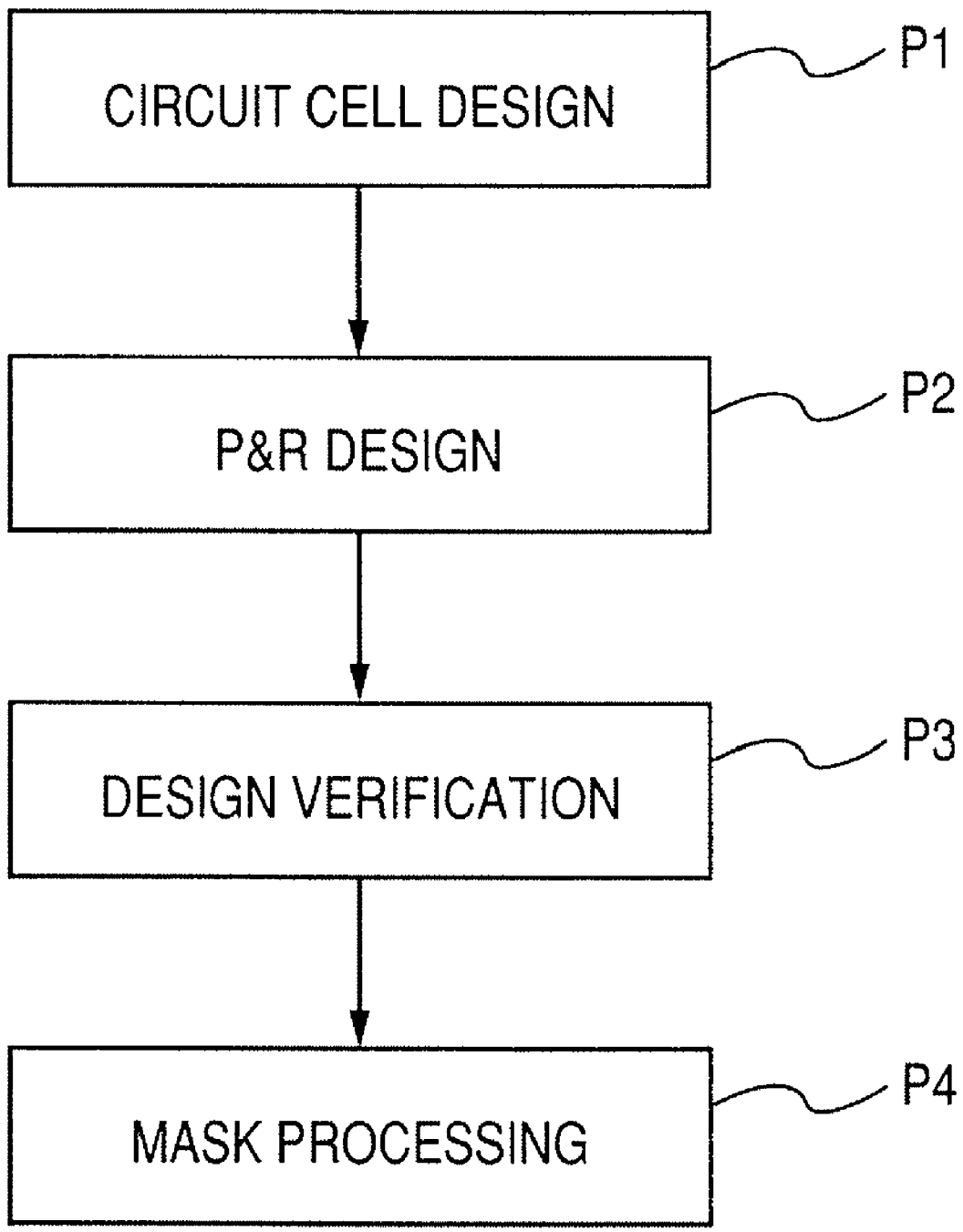
FIG. 4 is a flowchart illustrating a method of designing the circuit cell that forms the logic circuit included in the semiconductor integrated circuit according to the embodiment of the present invention, and a method of arranging a plurality of the circuit cells.

FIG. 4 is a flowchart illustrating the method of designing a circuit cell of this embodiment and the method of arranging the circuit cells.

Figure 5:
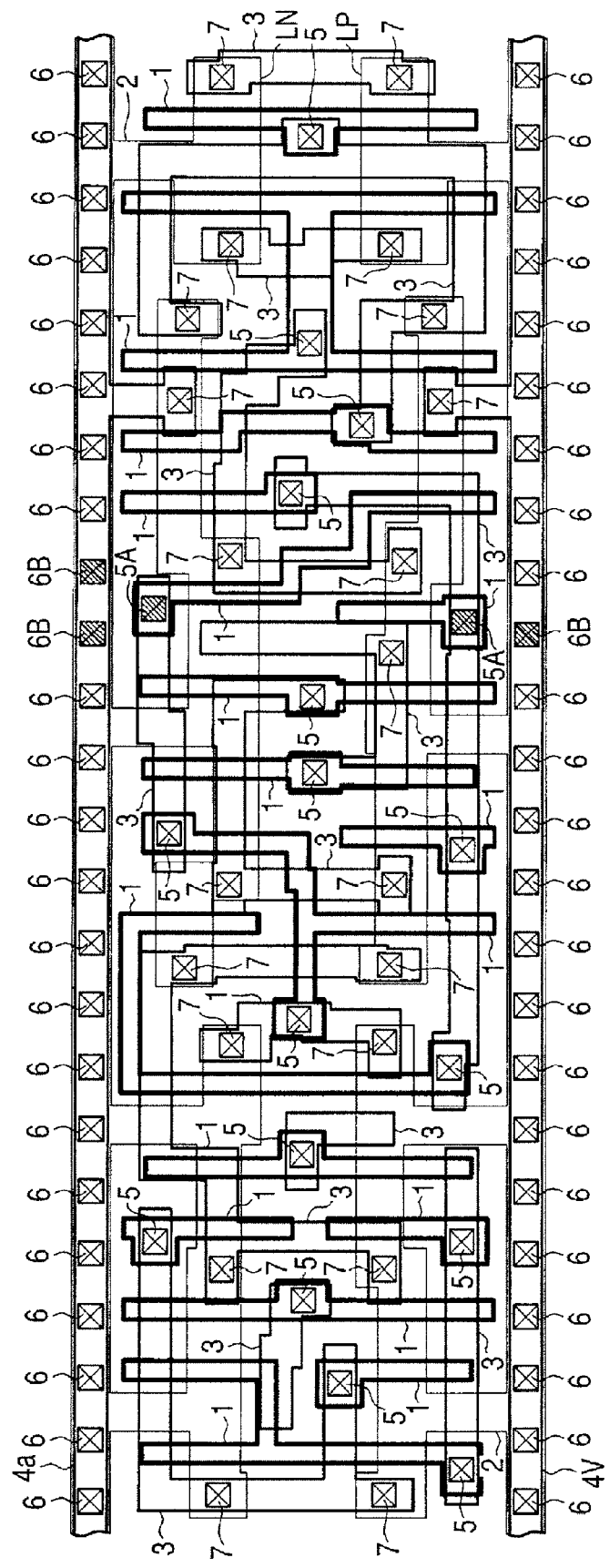
FIG. 5 is a plan view of a circuit cell that forms a logic circuit included in a semiconductor integrated circuit according to an embodiment of the present invention.
Figure 6:
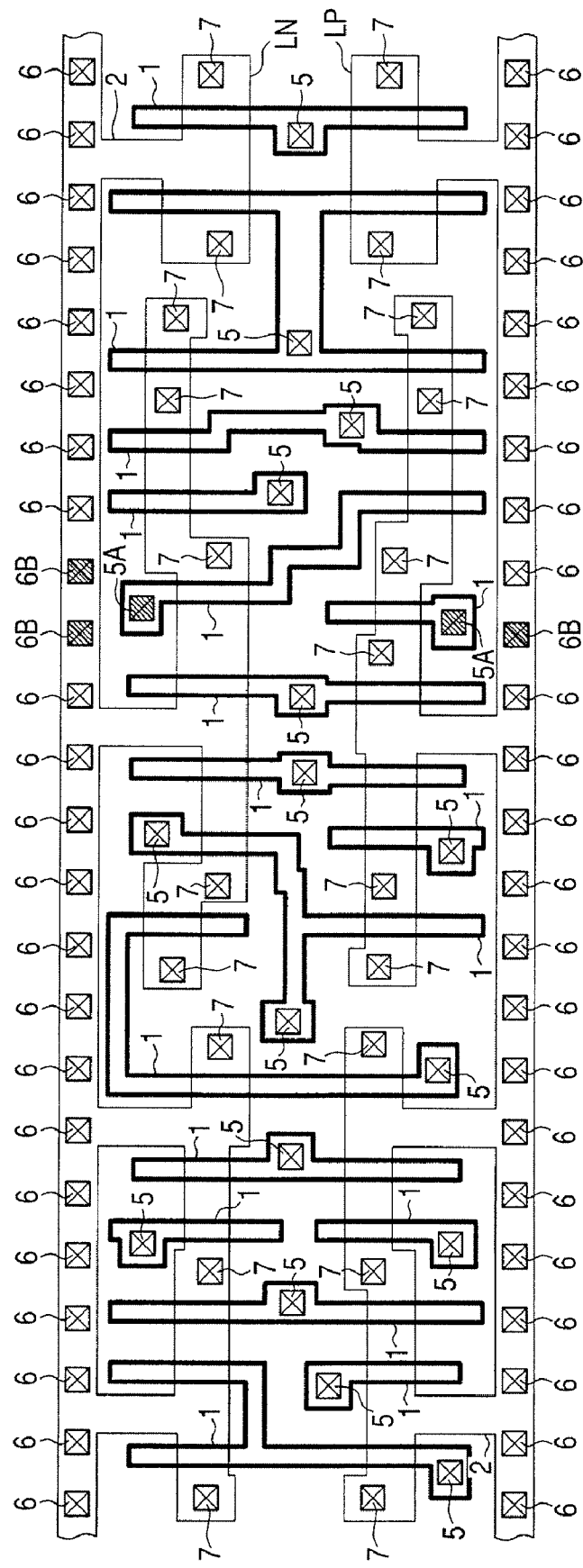
FIG. 6 is a plan view of the circuit cell that forms the logic circuit included in the semiconductor integrated circuit according to the embodiment of the present invention.
Figure 7:
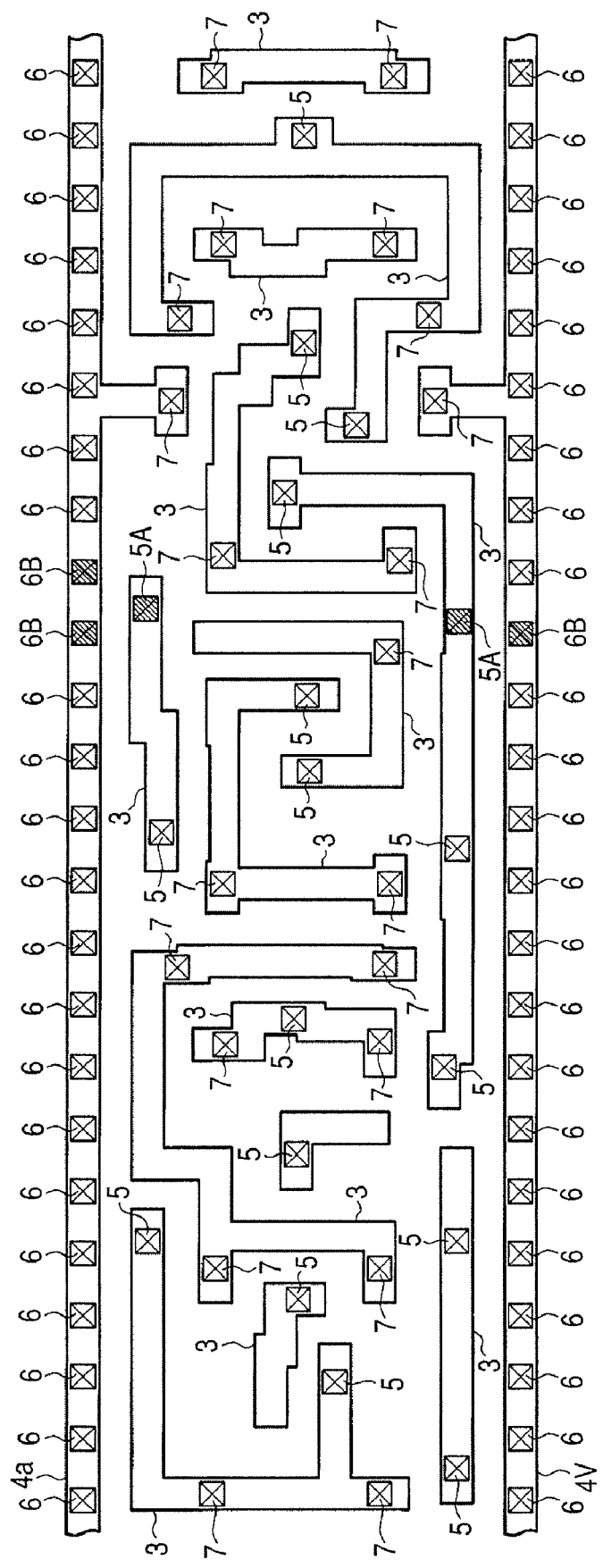
FIG. 7 is a plan view of the circuit cell that forms the logic circuit included in the semiconductor integrated circuit according to the embodiment of the present invention.

First, a planar layout (a first layout) of an individual circuit cell that forms a logic circuit according to this embodiment is designed (Step P1). Here, FIG. 5 to FIG. 7 are plan views of one circuit cell. FIG. 6 and FIG. 7 are plan views of a principal part for clarifying the configurations of the active region 2, wirings 3, 4, and plugs 5, 6, and 7, and the connection status to other members. FIG. 6 illustrates only the gate electrode 1, the active region 2, and the plugs 5, 6, and 7 at the same positions as those of FIG. 5, and FIG. 7 illustrates only the wirings 3, 4 and the plugs 5, 6, and 7 at the same positions as those of FIG. 5. Moreover, the circuit cell shown in FIG. 5 to FIG. 7 has the height to allow six second layer wirings (M2 wirings) to pass through over the circuit cell. As described in FIG. 14, this cell is recognized as a cell allowing seven wirings including the wiring above one of the taps to pass through over the cell. Namely, the cell comprises a 7-pitch cell. In this embodiment, this is also true of the first layer wiring. Namely, the circuit cell of this embodiment is a circuit cell with a low cell height wherein up to a total of seven wirings 3, 4 can be arranged with the minimum feature size in the direction (direction perpendicular the page plane) intersecting (perpendicular to) the extending direction of the wiring 4.

At the design phase of the planar layout of an individual circuit cell, first, a plurality of plugs 6 is placed at equal intervals under the wiring 4 to which a power supply potential or a reference potential is supplied. Next, the plug 6 that cannot be sufficiently spaced from each of the plugs 5 connected to the gate electrode 1 is deleted from the planar layout. Note that, in FIG. 5 to FIG. 7, the plug 5 that cannot be sufficiently spaced from the deleted plug 6 is illustrated as the plug 5A. Next, in this planar layout, an identification mark 6B is placed at the position of the deleted plug 6.

Figure 8:
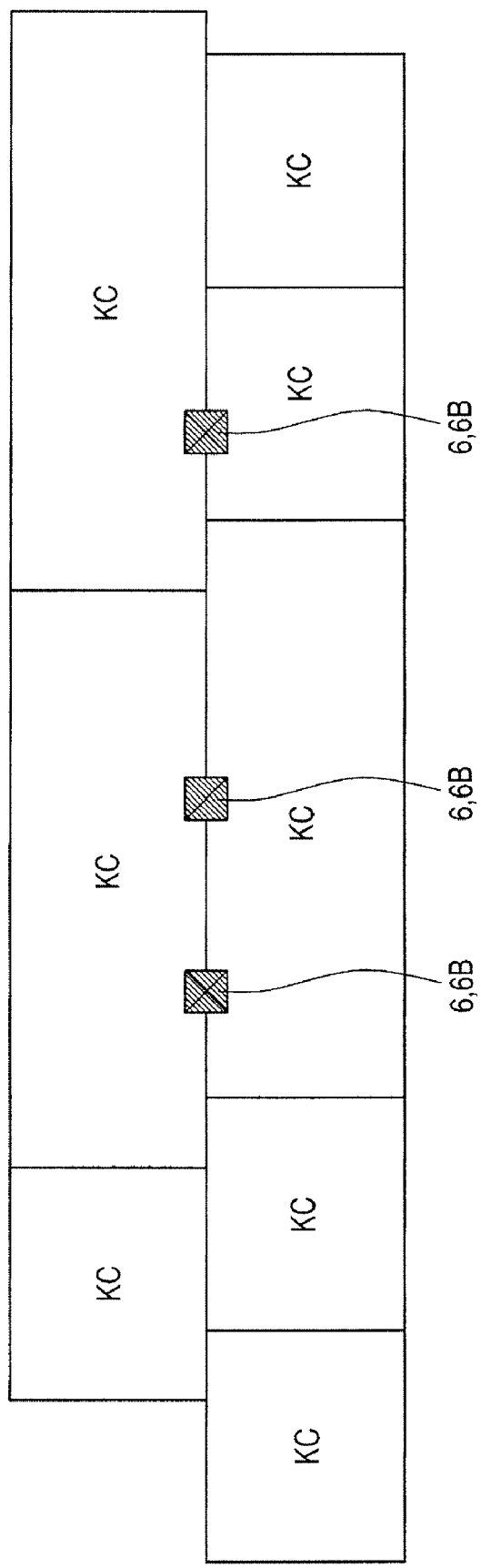
FIG. 8 is an explanatory diagram illustrating a method of arranging a plurality of circuit cells that forms a logic circuit included in a semiconductor integrated circuit according to an embodiment of the present invention.

Next, the placement layout of individual circuit cells that were layout-designed in Step P1 is designed by P&R (Place and Route) design, and then a planar layout (a second layout) of the entire semiconductor chip including the logic circuit of this embodiment is completed (Step P2). In this case, as shown in FIG. 8, with regard to individual circuit cells KC, the placement layout is designed as rectangular blocks.

Next, the design verification (Design Rule Check; DRC) of the planar layout of the entire semiconductor chip is performed, and then a GDS (Graphic Data System) is prepared (Step P3).

As described above, the wiring 4 (see FIG. 1, FIG. 3, FIG. 5, and FIG. 8) to which a high potential, such as a power supply potential or a reference potential, is supplied has a portion extending between two adjacent circuit cells KC, and the portion extending between the two adjacent circuit cells KC is a portion included in the two circuit cells KC in common. Hence, the relevant wiring 4 serves as an outer edge of the circuit cell KC that is the rectangular block in FIG. 8. For this reason, even if the above-described identification mark 6B is placed in the wiring 4 in one of the two adjacent circuit cells KC, the plug 6 may be placed at the corresponding position of the wiring 4 in the other circuit cell KC (see FIG. 8).

Then, in this Step P3, the design verification of the planar layout of the entire semiconductor chip is performed using a rule (computation processing) that if the identification mark 6B placed in one of the two adjacent circuit cells KC and the plug 6 of the other circuit cell KC are overlapped with each other, then the relevant overlapped plug 6 is deleted from the planar layout. Namely, in this Step P3, all of the plugs 6 overlapped with the identification mark 6B can be collectively deleted from the planar layout of the entire semiconductor chip, and the GDS for manufacturing a desired mask can be prepared.

Since the wiring layer in which the plug 6 to be deleted from the layout is present is known in advance, even the case where Step P1 of the planar layout design of the individual circuit cell KC is performed by one company and Step P2 of the P&R design is performed by other company, for example, can be easily handled because the plug 6 that is overlapped with the identification mark 6B by the P&R design just needs to be deleted from the planar layout.

Moreover, which circuit cell KC is adjacent to a certain circuit cell KC is not determined until the P&R design of Step P2 is completed. For this reason, it is difficult to delete all of the plugs 6 to be deleted, from the planar layout at the design phase of the planar layout of the individual circuit cells KC. However, by making a rule (computation processing) of forcibly deleting the plug 6 overlapped with the identification mark 6B from the planar layout in the design verification in Step P3, the plug 6 to be deleted can be easily deleted from the planar layout.

Next, based on the GDS prepared in Step P3, a mask for circuit pattern transfer is prepared (Step P4). Thereby, a circuit pattern, in which the plug 6 that cannot be sufficiently spaced from each of the plugs 5 has been deleted, can be drawn onto a mask, and using this mask, a circuit pattern in which each of the plugs 5 is sufficiently spaced from the plug 6 can be transferred to a semiconductor substrate.

According to the embodiment as described above, among the plugs 6 to which the power supply potential or the reference potential is supplied, the plug 6 that cannot be sufficiently spaced from the plug 5 to be connected to the gate electrode 1 is deleted at the time of the planar layout design. Therefore, the relevant plug 6 can be sufficiently spaced from each of the plugs 5 without expanding the planar size of the circuit cell KC, in particular the planar size in the direction intersecting (perpendicular to) the extending direction of the wiring 4 that extends over the plugs 6.

Figure 9:
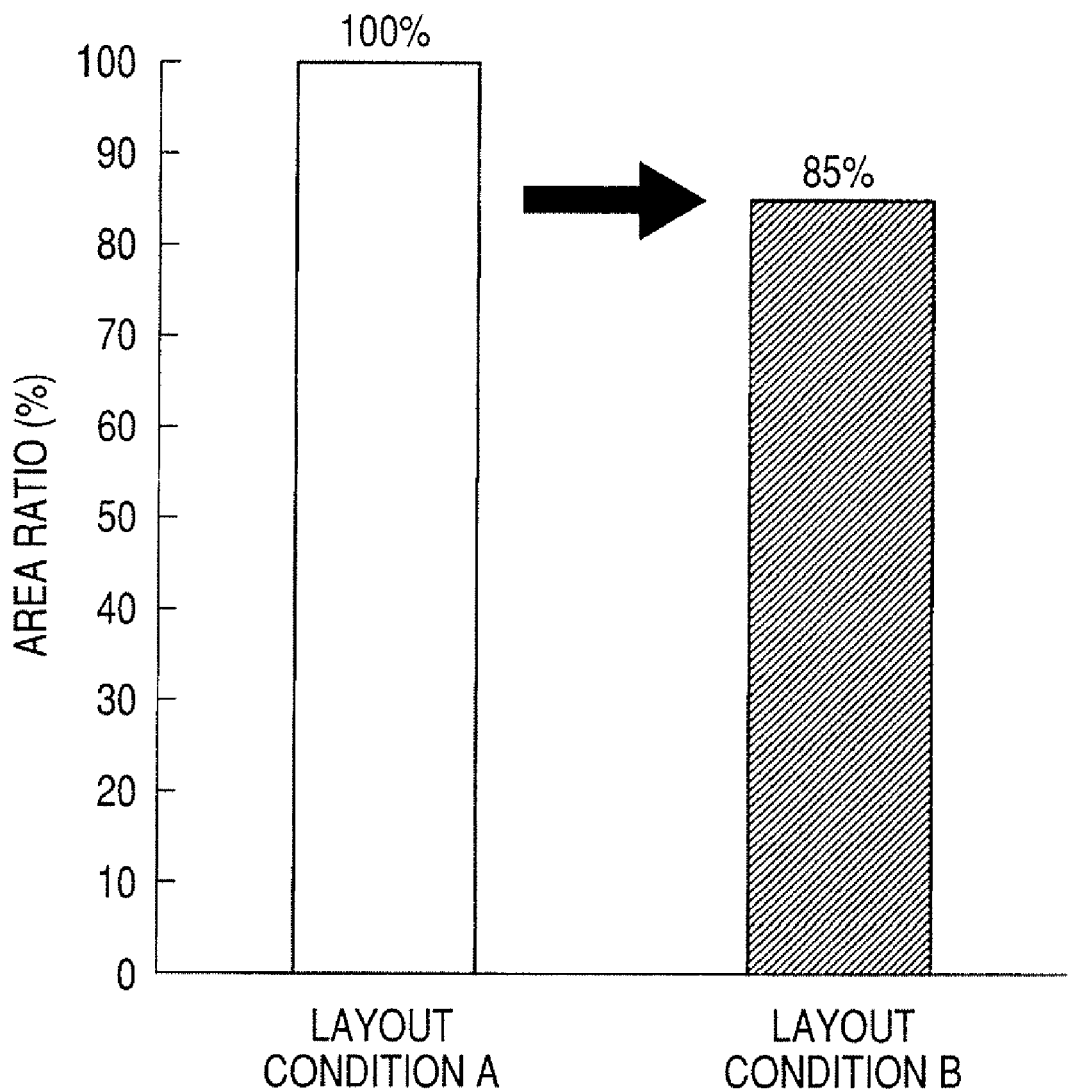
FIG. 9 is an explanatory diagram for comparing the area of a circuit cell that forms a logic circuit included in a semiconductor integrated circuit with the area of a circuit cell that is formed with sufficient spacing between specified plugs according to an embodiment of the present invention.
Figure 10:
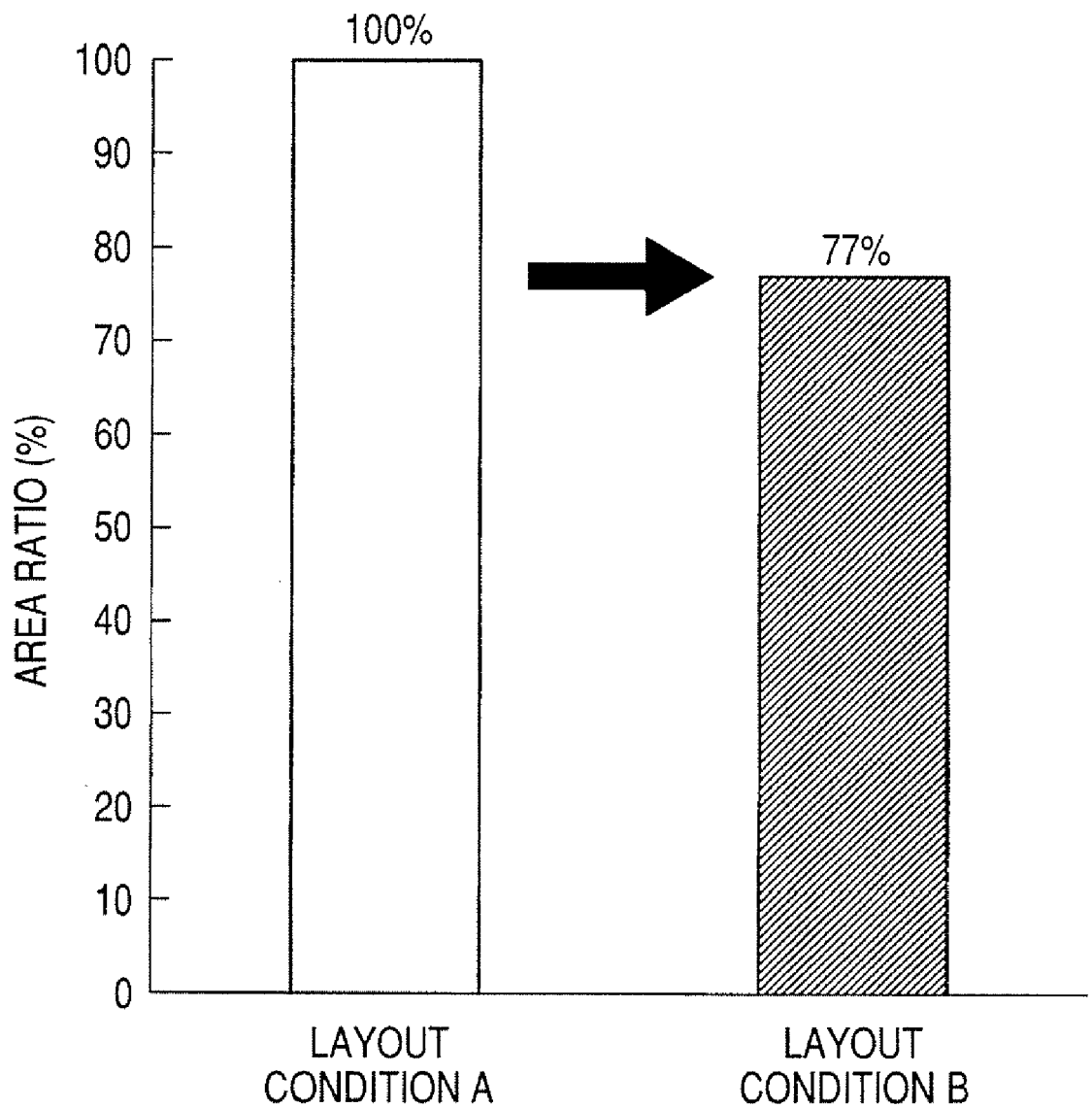
FIG. 10 is an explanatory diagram for comparing the area of a circuit cell that forms a logic circuit included in a semiconductor integrated circuit with the area of a circuit cell that is formed with sufficient spacing between specified plugs according to an embodiment of the present invention.
Figure 11:
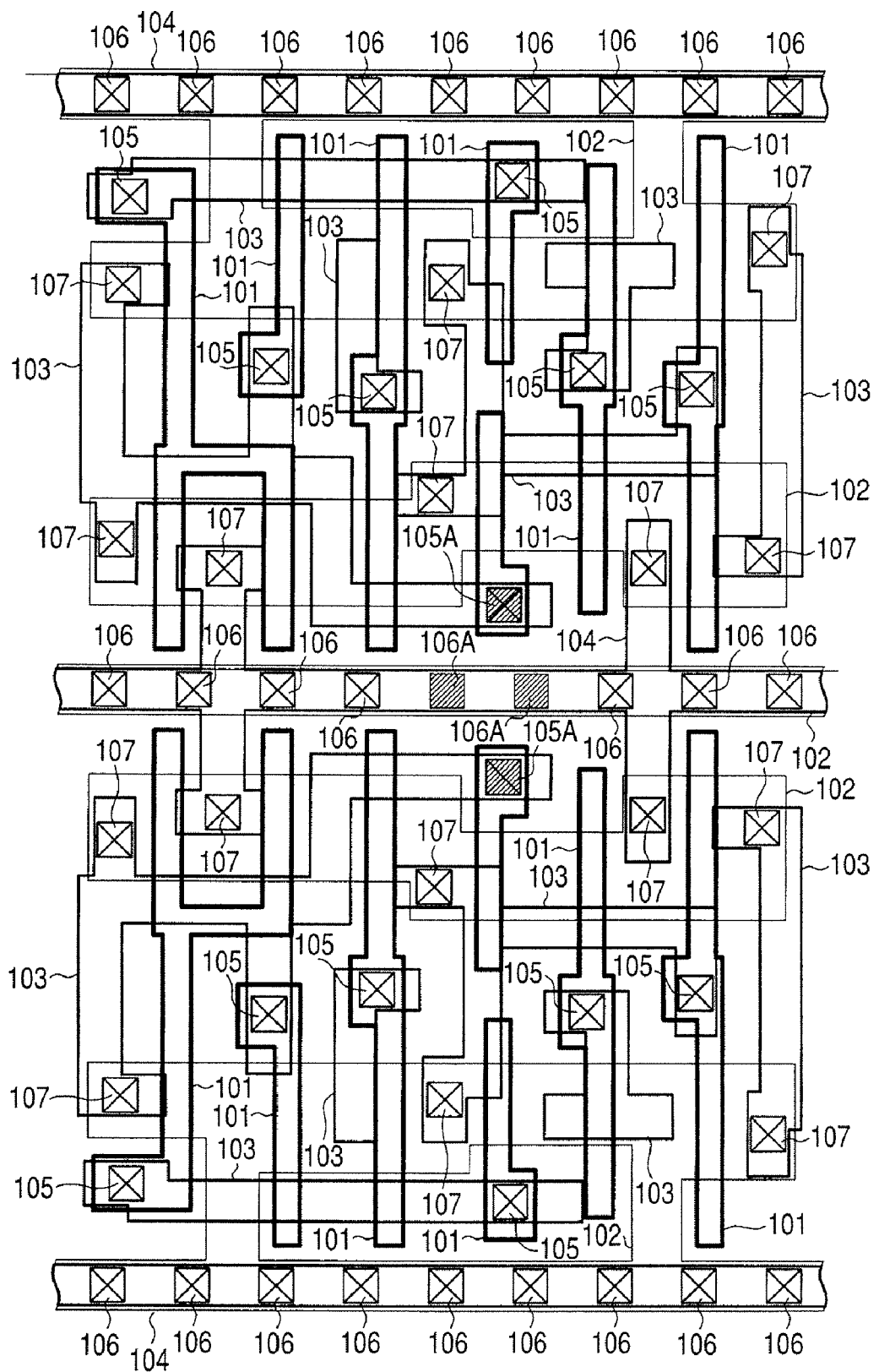
FIG. 11 is a plan view of a principal part of a circuit cell that forms a logic circuit included in a semiconductor integrated circuit.
Figure 12:
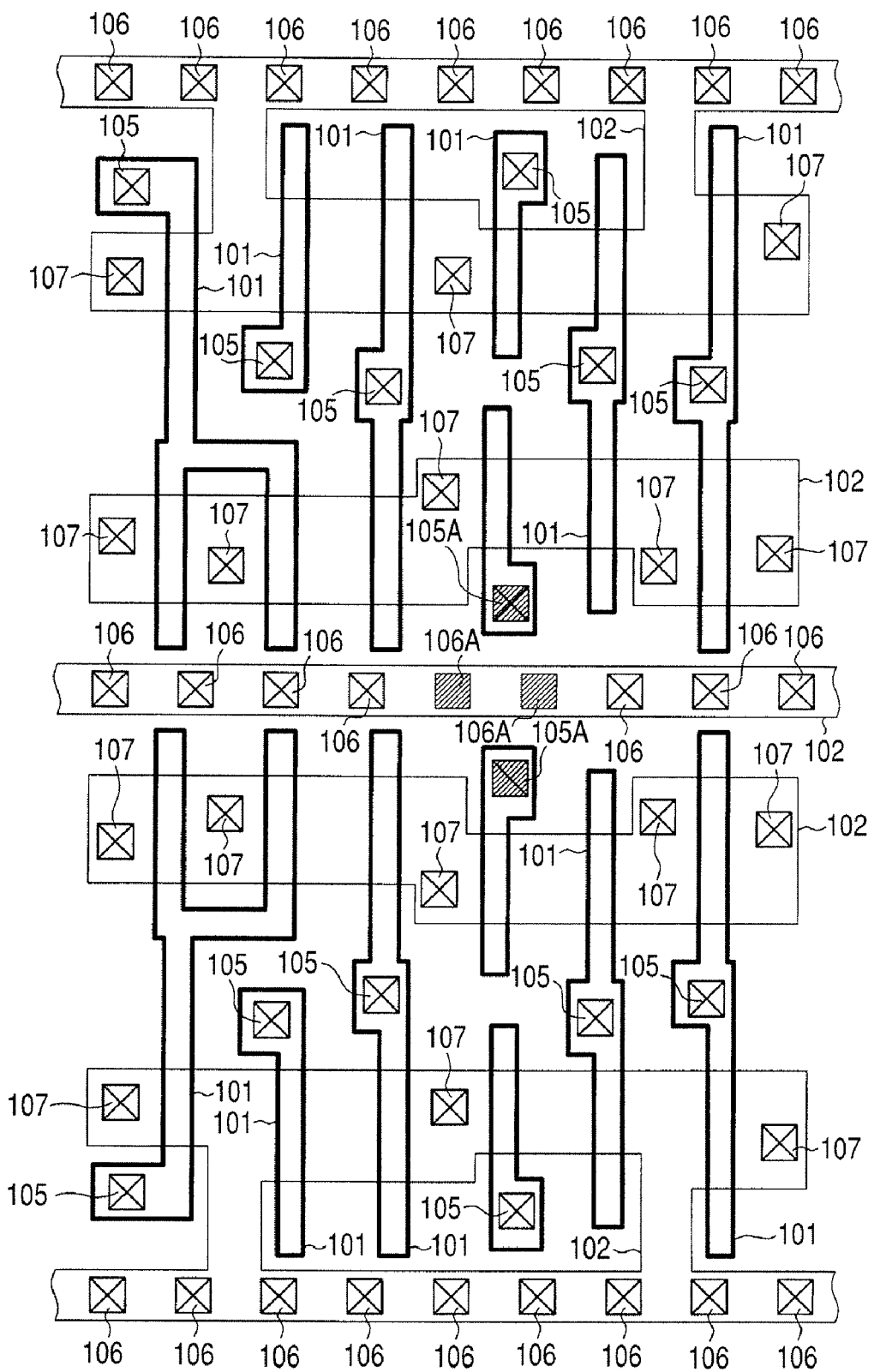
FIG. 12 is a plan view of the principal part of the circuit cell that forms the logic circuit included in the semiconductor integrated circuit.
Figure 13:
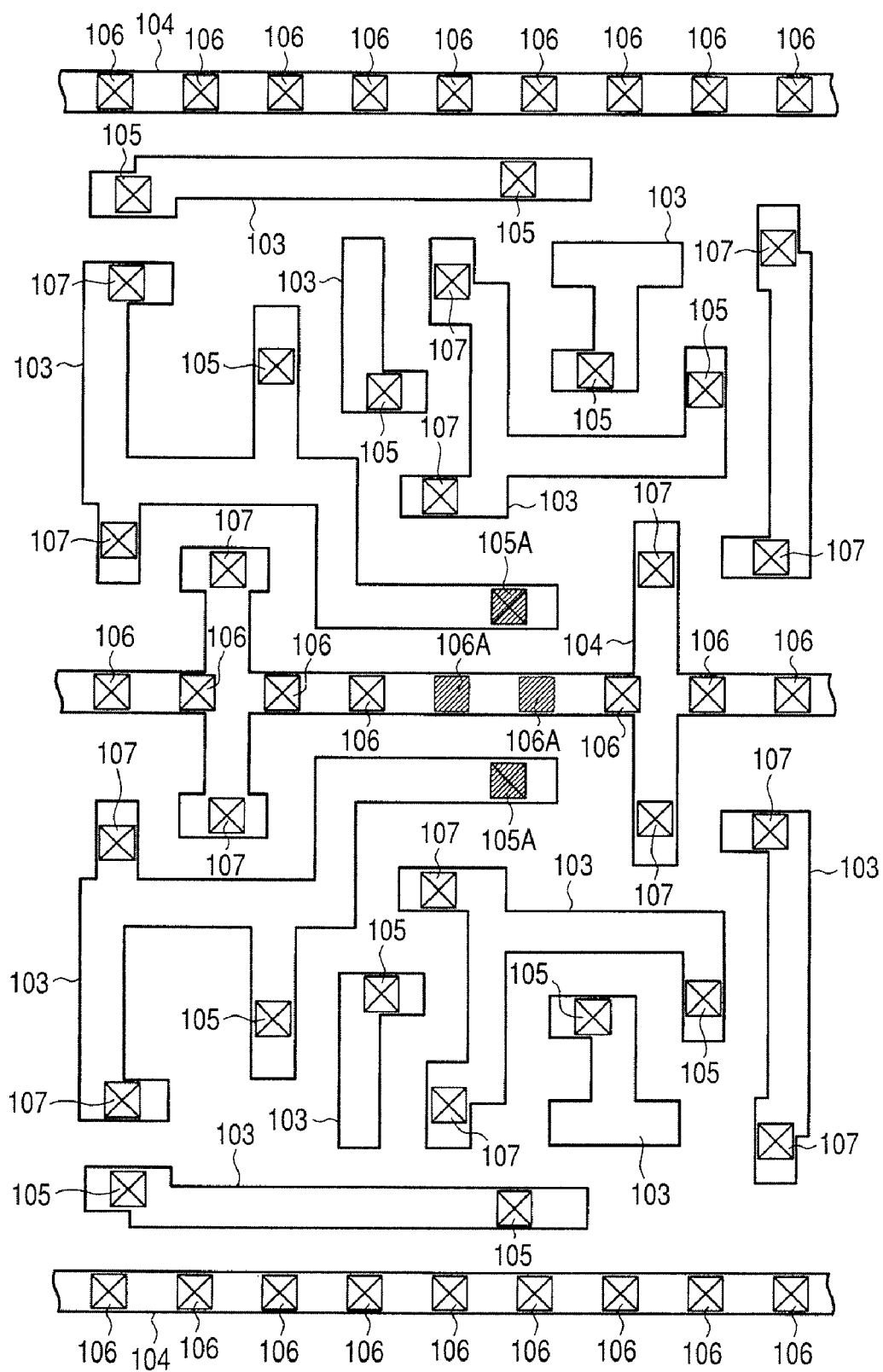
FIG. 13 is a plan view of the principal part of the circuit cell that forms the logic circuit included in the semiconductor integrated circuit.

Incidentally, the layout condition of the circuit cell KC when the plug 5 and the plug 6 are minimally spaced from each other by expanding the planar size of the circuit cell KC without deleting the plug 6 that cannot be sufficiently spaced from the plug 5 is represented by A, and the layout condition when a specified plug 6 is deleted at the time of the planar layout design as in this embodiment is represented by B. Here, according to the simulation performed by the present inventors, when the area of the circuit cell KC in the layout condition A is normalized to 100%, the area of the circuit cell KC in the layout condition B could be reduced down to approximately 85% in the case where the circuit cell KC is a selector circuit (see FIG. 9) and could be reduced down to approximately 96.8% as the entire semiconductor chip. Moreover, the area of the circuit cell KC in the layout condition B could be reduced down to approximately 77% in the case where the circuit cell KC is a flip-flop circuit (see FIG. 10). That is, according to this embodiment, only the plug 6 that is not sufficiently spaced from the plug 5 is deleted at the time of the planar layout design. It is therefore possible to achieve miniaturization of the circuit cell KC while preventing degradation of the reliability, such as degradation of the characteristic of an MISFET in the circuit cell KC, a decrease of the operation speed of the circuit, or that sufficient power cannot be supplied to the circuit.

Moreover, according to this embodiment, even when an integrated circuit is formed by a plurality of circuit cells KC that are layout-designed so as to minimize the planar size, only the plug 6 that is not sufficiently spaced from the plug 5 can be easily deleted at the time of the planar layout design. Therefore, various kinds of integrated circuits can be easily designed with the minimum size, and the deployment of circuit design can be improved.

As described above, the present invention made by the present inventor has been described specifically based on the embodiments, however, it is obvious that the present invention is not limited to the above-described embodiments and various modifications may be made without departing from the scope thereof.

For example, 7-pitch cells have been described in the present embodiments, but not limited thereto, and for example, the present invention can be similarly applied to less than 7 pitch cells, such as a 6 pitch or a 5 pitch cell.

Moreover, an example of forming the gate electrode 1 from a polysilicon film is shown in the present embodiments, but not limited thereto, and for example, the gate electrode 1 may be formed from a metal film. As such a metal film, Ti, TiN, Pt, or Al is enumerated.

Moreover, an example of forming the gate insulating film from a silicon oxide film is shown in the present embodiments, but not limited thereto, and for example, the gate insulating film may be formed from a film having a dielectric constant higher than that of the silicon nitride film. As such a film having a high dielectric constant, HfO, HfAlO, HfSiO, ZrO, ZrAlO, ZrSiO, LaO, LaSiO, TaO, or TiO is enumerated.

The semiconductor integrated circuit device of the present invention and the method of manufacturing the same can be applied to the manufacture process of a semiconductor integrated circuit device having an integrated circuit formed from a highly miniaturized circuit cell.

What is claimed is:
1. A method of manufacturing a semiconductor integrated circuit device having an integrated circuit, the method comprising the steps of:
   (a) preparing a first layout of the integrated circuit including a plurality of active regions, a plurality of gate electrodes, a plurality of signaling wirings, a plurality of power-feeding wirings, a plurality of signaling plugs, and a plurality of power-feeding plugs; and (b) deleting the power-feeding plug that is placed within a first distance from each of the signaling plugs among the power-feeding plugs from the first layout, wherein in the step (a), the power-feeding plugs for electrically connecting the power-feeding wiring to the active region are placed under the power-feeding wiring, wherein a potential higher than that of the signaling wiring and the signaling plug is supplied to the power-feeding wiring and the power-feeding plug, and wherein the power-feeding plug deleted from the first layout in the step (b) is close to the signaling plug, close enough to impair an operation of the integrated circuit.

2. The method of manufacturing a semiconductor integrated circuit device according to claim 1,
wherein the first distance is 1.5 times a diameter of the signaling plug.

3. The method of manufacturing a semiconductor integrated circuit device according to claim 2,
wherein in the step (a), the power-feeding plugs are placed at equal intervals under the power-feeding wirings.

4. The method of manufacturing a semiconductor integrated circuit device according to claim 2,
wherein the integrated circuit is formed from one or more circuit cells, and
wherein the step (a) and the step (b) are performed on each of the circuit cells.

5. The method of manufacturing a semiconductor integrated circuit device according to claim 4,
wherein the power-feeding wiring and the power-feeding plug are arranged between two adjacent circuit cells and are commonly included in the first layout of both of the two adjacent circuit cells; and
wherein in the step (b), an identification mark is placed at a position of the power-feeding plug that has been deleted from the first layout, and the method further comprising the step of (c) forming a second layout of the integrated circuit by arranging each of the first layouts of the circuit cells, and then deleting the power-feeding plug at a position where the power-feeding plug is overlapped with the identification mark, from the second layout.

6. The method of manufacturing a semiconductor integrated circuit device according to claim 5,
wherein the second layout is a layout of an entire semiconductor chip, and
wherein a mask for transferring a pattern of the integrated circuit is manufactured based on the second layout.

7. The method of manufacturing a semiconductor integrated circuit device according to claim 2,
wherein the first layout is formed within such a small planar region that the power-feeding plug to be deleted in the step (b) cannot be formed spaced by at least the first distance from the closest signaling plug.

8. The method of manufacturing a semiconductor integrated circuit device according to claim 2,
wherein the first layout reduces a planar size of a semiconductor chip having the integrated circuit, in a direction intersecting an extending direction of the power-feeding wirings.

* * * * *